United States Patent
Shimizu et al.

(10) Patent No.: US 10,559,460 B2
(45) Date of Patent: Feb. 11, 2020

(54) FILM FORMING APPARATUS AND FILM FORMING METHOD

(71) Applicants: TOKYO ELECTRON LIMITED, Minato-ku, Tokyo (JP); TOHOKU UNIVERSITY, Sendai-shi, Miyagi (JP)

(72) Inventors: Akira Shimizu, Nirasaki (JP); Katsutoshi Ishii, Nirasaki (JP); Akinobu Teramoto, Sendai (JP); Tomoyuki Suwa, Sendai (JP); Yoshinobu Shiba, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/123,416

(22) Filed: Sep. 6, 2018

(65) Prior Publication Data
US 2019/0074177 A1 Mar. 7, 2019

(30) Foreign Application Priority Data
Sep. 7, 2017 (JP) ................................ 2017-172348

(51) Int. Cl.
*H01L 21/31* (2006.01)
*H01L 21/02* (2006.01)
(Continued)

(52) U.S. Cl.
CPC ...... *H01L 21/02277* (2013.01); *C23C 16/345* (2013.01); *C23C 16/482* (2013.01); *H01L 21/0217* (2013.01); *H01L 21/67017* (2013.01)

(58) Field of Classification Search
CPC .......... H01L 21/02277; H01L 21/0217; H01L 21/67017; H01L 21/67103; H01L 21/68742; C23C 16/345; C23C 16/482
(Continued)

(56) References Cited

U.S. PATENT DOCUMENTS 4,441,815 A * 4/1984 Izumi ..................... G01J 3/433
250/373
6,649,545 B2 * 11/2003 Agarwal ............... C23C 16/452
438/798
(Continued)

FOREIGN PATENT DOCUMENTS

JP          H10098032 A      4/1998
JP          2004128195 A     4/2004
(Continued)

*Primary Examiner* — Vu A Vu
(74) *Attorney, Agent, or Firm* — Nath, Goldberg & Meyer; Jerald L. Meyer (57) ABSTRACT

There is provided a film forming apparatus for forming a silicon nitride film on a substrate by having a precursor gas containing silicon to react with a reaction gas containing nitrogen, including: a processing container configured to form a vacuum atmosphere; a substrate mounting part installed in the processing container; a precursor gas supply part configured to supply a precursor gas into the processing container; a reaction gas supply part configured to supply a reaction gas containing nitrogen into the processing container; and an ultraviolet irradiating part configured to excite the reaction gas before the reaction gas reacts with the precursor gas, wherein a substrate on the substrate mounting part is not irradiated with an ultraviolet ray emitted from the ultraviolet irradiating part.

16 Claims, 10 Drawing Sheets

(51) Int. Cl.
  *C23C 16/48* (2006.01)
  *C23C 16/34* (2006.01)
  *H01L 21/67* (2006.01)

(58) Field of Classification Search
  USPC .......................................................... 438/792
  See application file for complete search history.

(56) References Cited

U.S. PATENT DOCUMENTS 9,435,031 B2 *  9/2016  Grill ........................ C23C 16/52
9,448,108 B2 *  9/2016  Jing ............................ G01J 1/50

FOREIGN PATENT DOCUMENTS

| JP | 2010103484 A | 5/2010 |
|----|--------------|--------|
| JP | 2012076033 A | 4/2012 |

\* cited by examiner

FILM FORMING APPARATUS AND FILM FORMING METHOD

CROSS-REFERENCE TO RELATED APPLICATION

This application is based upon and claims the benefit of priority from Japanese Patent Application No. 2017-172348, filed on Sep. 7, 2017, the entire contents of which are incorporated herein by reference.

TECHNICAL FIELD

The present disclosure relates to a technique for performing a film forming process by supplying a process gas onto a surface of a target substrate.

BACKGROUND

In a semiconductor integrated circuit, a silicon nitride film (SiN film) is used for a wide range of applications including an etching stopper, a sidewall spacer, and a stress liner for generating a distortion in a channel region, in addition to an insulating film. In a case of forming a thin film in a semiconductor manufacturing process, in addition to satisfactorily embedding fine patterns and good film quality, it is necessary to lower the temperature of a film forming process according to demands for suppression of migration of wirings, solidification of semiconductor devices and so forth.

However, for example, a nitriding gas such as an ammonia gas or the like is hardly nitrided unless it is subjected to a high temperature treatment. A silicon nitride film may be formed at a relatively low temperature by activating the nitriding gas with plasma. However, when the silicon nitride film is formed by plasma film formation, there is a problem that a substrate is damaged by energy used to turn a gas into plasma.

Conventionally, there is known a technique for forming a film by activating a process gas supplied onto a substrate placed in a processing container while irradiating an interior of the processing container with an ultraviolet ray. However, this technique has a problem that the bond of an already deposited silicon nitride film is broken when the substrate is irradiated with the ultraviolet ray. In addition, when the interior of the processing container is irradiated with the ultraviolet ray through a transmission window installed in the processing container, a silicon nitride film may be formed on a surface of the transmission window exposed in the processing container, which may inhibit the ultraviolet ray from being irradiated in the interior of the processing container.

SUMMARY

Some embodiments of the present disclosure provide a technique for forming a high quality silicon nitride film at a low temperature while suppressing damage to a substrate.

According to one embodiment of the present disclosure, there is provided a film forming apparatus for forming a silicon nitride film on a substrate by having a precursor gas containing silicon to react with a reaction gas containing nitrogen, including: a processing container configured to form a vacuum atmosphere; a substrate mounting part installed in the processing container; a precursor gas supply part configured to supply a precursor gas into the processing container; a reaction gas supply part configured to supply a reaction gas containing nitrogen into the processing container; and an ultraviolet irradiating part configured to excite the reaction gas before the reaction gas reacts with the precursor gas, wherein a substrate on the substrate mounting part is not irradiated with an ultraviolet ray emitted from the ultraviolet irradiating part.

According to another embodiment of the present disclosure, there is provided a method of forming a silicon nitride film on a substrate by having a precursor gas containing silicon to react with a reaction gas containing nitrogen, including: mounting a substrate on a mounting part in a processing container, supplying a precursor gas into the processing container in a state where an interior of the processing container is in a vacuum atmosphere; exciting the reaction gas with an ultraviolet ray before the reaction gas reacts with the precursor gas; and supplying the excited reaction gas into the processing container, wherein the substrate on the mounting part is not irradiated with the ultraviolet ray.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
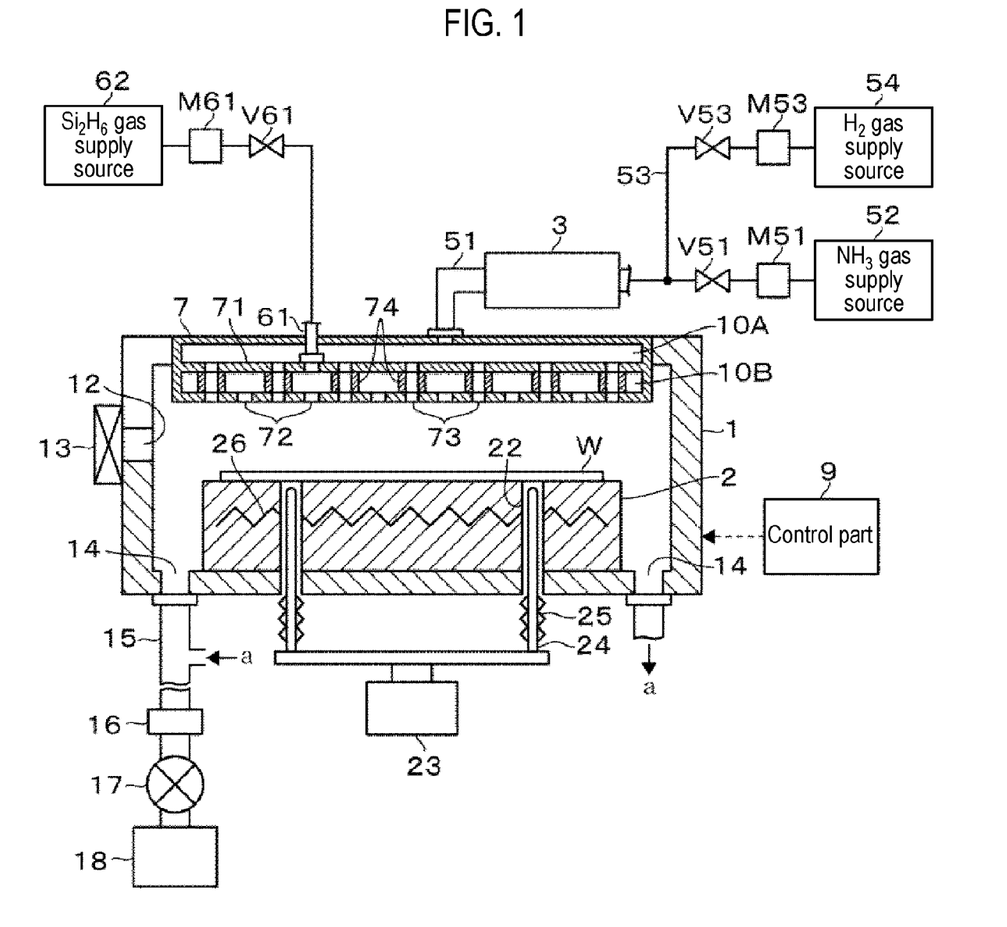
FIG. 1 is a longitudinal sectional view showing a film forming apparatus according to an embodiment of the present disclosure.

A film forming apparatus according to an embodiment of the present disclosure will now be described. As shown in FIG. 1, a film forming apparatus includes a processing container 1 which is a vacuum chamber having a substantially circular cross-section. A loading/unloading port 12 for delivering a wafer W having a diameter of, for example, 300 mm, as a target substrate, is installed on a side surface of the processing container 1. A gate valve 13 for opening and closing the loading/unloading port 12 is installed at the loading/unloading port 12.

A mounting table 2, which has a cylindrical shape and is a mounting part of the wafer W, is installed in the processing container 1. Three through-holes 22 penetrating through the mounting table 2 and a bottom surface of the processing container 1 are formed at equal intervals in the circumferential direction. Push-up pins 24 for delivering the wafer W are respectively installed in the through-holes 22 so as to protrude from and retracted into the upper surface of the mounting table 2 by an elevating mechanism 23. Lower portion of the push-up pins 24 is covered with a bellows 25 for hermetically sealing the processing container 1. A heater 26 serving as a heating part is installed inside the mounting table 2 so as to heat the wafer W mounted on the mounting table 2 to 350 degrees C., for example.

An exhaust port 14 is installed on the bottom surface of the processing container 1. One end of an exhaust pipe 15 is connected to the exhaust port 14. The other end of the exhaust pipe 15 is connected to a vacuum exhaust part 18 which is a vacuum exhaust mechanism, via a pressure regulating valve 16 and an opening/closing valve 17 from the exhaust port 14 side.

A shower head 7 for supplying a gas toward the wafer W mounted on the mounting table 2 is installed on a ceiling plate of the processing container 1. The shower head 7 is formed in a cylindrical shape. An interior of the shower head 7 is partitioned by a partitioning plate 71 into upper and lower stages (two stages), such as an upper diffusion chamber 10A for diffusing a reaction gas containing nitrogen (N), for example, an ammonia ($NH_3$) gas, and a lower diffusion chamber 10B for diffusing a precursor gas containing silicon (Si), for example, a disilane ($Si_2H_6$) gas.

One end of an $NH_3$ gas introduction path 51 for introducing an $NH_3$ gas into the upper diffusion chamber 10A is connected to a ceiling portion of the upper diffusion chamber 10A. An $NH_3$ gas supply source 52 is connected to the other end of the $NH_3$ gas introduction path 51. In the $NH_3$ gas introduction path 51, a flow rate adjusting part M51, a valve V51 and an ultraviolet irradiating part 3 for irradiating a gas flowing through the $NH_3$ gas introduction path 51 with an ultraviolet ray are installed in this order from the $NH_3$ gas supply source 52 side.

In addition, one end of a $H_2$ gas introduction path 53 for introducing an additive gas, for example, a hydrogen ($H_2$) gas, together with the $NH_3$ gas, joins to a portion between the valve V51 and the ultraviolet irradiating part 3 in the $NH_3$ gas introduction path 51. A $H_2$ gas supply source 54 is connected to the other end of the $H_2$ gas introduction path 53. A flow rate adjusting part M53 and a valve V53 are installed in the $H_2$ gas introduction path 53 in this order from the $H_2$ gas supply source 54 side.

Upper end portions of communicating passages 74 formed in the lower diffusion chamber 10B are opened on a bottom surface (partitioning plate 71) of the upper diffusion chamber 10A. A lower end portion of each communicating passage 74 is connected to each of $NH_3$ gas discharge holes 73 formed on a lower surface of the shower head 7 so as to correspond to each communicating passage 74. Therefore, a gas in the upper diffusion chamber 10A is supplied into the processing container 1 without diffusing into the lower diffusion chamber 10B. In this embodiment, the $NH_3$ gas introduction path 51, the flow rate adjusting part M51, the valve V51, the $NH_3$ gas supply source 52, the upper diffusion chamber 10A, the communicating passage 74 and the $NH_3$ gas discharge holes 73 constitute a reaction gas supply part for supplying an $NH_3$ gas as a reaction gas into the processing container 1.

$Si_2H_6$ gas discharge holes 72 communicating the lower diffusion chamber 10B and the processing container 1 are installed and distributed over the entire bottom surface of the lower diffusion chamber 10B (the lower surface of the shower head 7). In addition, as shown in FIG. 1, one end of a $Si_2H_6$ gas introduction path 61 for introducing a $Si_2H_6$ gas into the lower diffusion chamber 10B without being diffused into the upper diffusion chamber 10A is connected to the ceiling portion (partitioning plate 71) of the lower diffusion chamber 10B. The other end of the $Si_2H_6$ gas introduction path 61 is connected to a $Si_2H_6$ gas supply source 62 while penetrating through the ceiling plate of the shower head 7. Further, a flow rate adjusting part M61 and a valve V61 are installed in the $Si_2H_6$ gas introduction path 61 in this order from the $Si_2H_6$ gas supply source 62 side. In this embodiment, the $Si_2H_6$ gas introduction path 61, the flow rate adjusting part M61, the valve V61, the $Si_2H_6$ gas supply source 62, the lower diffusion chamber 10B and the $Si_2H_6$ gas discharge holes 72 constitute a precursor gas supply part for supplying a $Si_2H_6$ gas as a precursor gas into the processing container 1.

Figure 2:
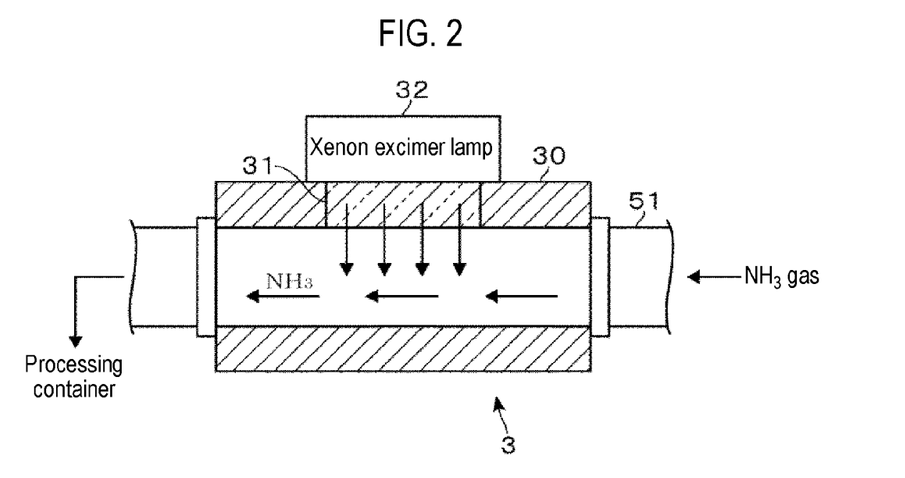
FIG. 2 is a sectional view showing an ultraviolet irradiation part.

The ultraviolet irradiating part 3 will be described with reference to FIG. 2. The ultraviolet irradiating part 3 has a tubular irradiation chamber 30 forming a part of the $NH_3$ gas introduction path 51. The $NH_3$ gas supplied from the $NH_3$ gas supply source 52 to the $NH_3$ gas introduction path 51 and the $H_2$ gas as the additive gas pass through the irradiation chamber 30 and flow to the processing container 1 side. An ultraviolet irradiation window 31 made of quartz is installed in the irradiation chamber 30. In addition, the ultraviolet irradiating part 3 includes a xenon excimer lamp 32 that is installed outside the irradiation chamber 30 and emits an ultraviolet ray having a main wavelength of, for example, 172 nm. A gas flowing through the irradiation chamber 30 is irradiated with the light emitted from the xenon excimer lamp 32 through the ultraviolet irradiation window 31. The main wavelength refers to a wavelength corresponding to the maximum peak or its vicinity in the spectrum.

Returning to FIG. 1, the film forming apparatus has a controller 9. The controller 9 is composed of, for example, a computer, and includes a program, a memory and a CPU. The program incorporates a step group so as to carry out a series of operations in the operation description to be described later. According to the program, the flow rate of each gas, the internal pressure of the processing container 1 and so forth are adjusted. This program is stored in a computer storage medium, for example, a flexible disk, a compact disk, a hard disk, a magneto-optical disk or the like, and is installed in the controller 9.

Subsequently, the operation of the embodiment of the present disclosure will be described. The wafer W is mounted on the mounting table 2 by a cooperative action of, for example, an external transfer arm (not shown) and the push-up pins 24. Thus, the wafer W is heated to 350 degrees C., for example. Then, the gate valve 13 is closed to seal the processing container 1 and vacuum exhaust is performed to set the internal pressure of the processing container 1 at 133 Pa.

Next, the valve V61 is opened and the $Si_2H_6$ gas is supplied from the $Si_2H_6$ gas introduction path 61 to the shower head 7 at a flow rate of 0.5 sccm, for example. The $Si_2H_6$ gas diffuses in the horizontal direction in the lower diffusion chamber 10B of the shower head 7 and is supplied into the processing container 1 via the $Si_2H_6$ gas discharge holes 72. In addition, the valves V51 and V53 are opened, the $NH_3$ gas is supplied at a flow rate of 100 sccm, and the $H_2$ gas as an additive gas is supplied at a flow rate of 300 sccm. Thus, the $NH_3$ gas and the $H_2$ gas are mixed and are supplied to the ultraviolet irradiating part 3. Further, an ultraviolet ray having a wavelength of 172 nm is irradiated to the $NH_3$ gas introduction path 51 by the xenon excimer lamp 32.

Thus, the $NH_3$ gas contained in the mixed gas passing through the irradiation chamber 30 before being introduced into the shower head 7, that is, the $NH_3$ gas before reacting with the $Si_2H_6$ gas, is excited by being irradiated with the ultraviolet light, which is called remote ultraviolet irradiation. The excited $NH_3$ gas is supplied from the $NH_3$ gas introduction path 51 to the shower head 7, diffuses in the horizontal direction in the upper diffusion chamber 10A of the shower head 7 and is supplied into the processing container 1 from the $NH_3$ gas discharge holes 73 via the communicating passage 74. Thus, the $Si_2H_6$ gas reacts with the excited $NH_3$ gas in the processing container 1 to form a silicon nitride film (SiN film) which is deposited on a surface of the wafer W mounted on the mounting table 2.

For example, when the $NH_3$ gas is excited by applying a high frequency to the $NH_3$ gas before reacting with the $Si_2H_6$ gas, the energy of the active species of $NH_3$ becomes so large that the reactivity becomes extremely high. Therefore, the activated $NH_3$ reacts with the inactivated $NH_3$ and is inactivated before reaching the wafer W.

On the contrary, the $NH_3$ gas before reacting with the $Si_2H_6$ gas can be excited by irradiation with the ultraviolet ray so as to be appropriately activated. With such a configuration, the excited $NH_3$ reaching the wafer W can react with the $Si_2H_6$ even at a low heating temperature, for example, about 350 degrees C., to form a silicon nitride film having high strength on the wafer W.

According to the above embodiment, when the $Si_2H_6$ gas and the $NH_3$ gas are supplied onto the wafer W placed in the processing container 1 to form a SiN film, the $NH_3$ gas is subjected to the remote ultraviolet irradiation before reacting with the $Si_2H_6$ gas and then is supplied into the processing container 1. Therefore, it is possible to form a high quality silicon nitride film on the wafer W at a low heating temperature by the activated $NH_3$ gas and the $Si_2H_6$ gas.

In addition, since the $NH_3$ gas before being introduced into the processing container 1 is subjected to the remote ultraviolet irradiation, the wafer W is irradiated with no ultraviolet ray and there is accordingly no possibility that the already deposited SiN is exposed to the ultraviolet ray to break the bond of the nitride film. Further, the ultraviolet irradiating part 3 for irradiating the $NH_3$ gas with the ultraviolet ray is installed in the $NH_3$ gas introduction path 51 through which the $NH_3$ gas is introduced into the processing container 1, and the excited $NH_3$ gas and the $Si_2H_6$ gas are caused to react with each other in the processing container 1. Therefore, since the reaction products of the $Si_2H_6$ gas and the $NH_3$ gas do not adhere to the ultraviolet irradiation window 31 installed in the ultraviolet irradiating part 3, the inhibition of the ultraviolet irradiation can be avoided.

Further, as shown in Examples to be described later, although the SiN film can be formed even when the temperature of the processing atmosphere of the wafer W is set to the normal temperature, or more, a SiN film having a high nitrogen content rate can be formed by setting the temperature of the processing atmosphere of the wafer W to 200 degrees C. or higher. Further, as shown in Examples to be described later, by setting the temperature of the processing atmosphere of the wafer W to 300 degrees C. or higher, the refractive index of the wafer W reaches approximately "2", thereby obtaining SiN film having higher quality. Further, since there is no need to irradiate the $NH_3$ gas with the ultraviolet ray at a temperature at which the unexcited $NH_3$ gas reacts with a silicon-containing gas, the temperature of the processing atmosphere of the wafer W may be lower than 600 degrees C.

In the present disclosure, as in a film forming apparatus shown in FIG. 3 having the configuration used in the evaluation test to be described later, a reaction gas supply part for supplying a reaction gas may be installed in the side of the processing container on which the wafer W is placed. The absence of irradiating the wafer W with the ultraviolet ray includes a case where, even when the ultraviolet ray reaches the wafer W, the energy thereof is weak and there is accordingly no damage to the already formed SiN film, which affects a yield. Therefore, in the case of the configuration shown in FIG. 3, for example, even if the ultraviolet ray is reflected on the inner wall of a flow path and reaches the wafer W, it is handled as a state in which the wafer W is not irradiated with the ultraviolet ray.

The precursor gas of the present disclosure may be a dichlorosilane gas, a monosilane gas, a disilazane gas or the like. The reaction gas may be a nitrogen gas, a diazine gas, a hydrazine gas or the like.

Even when the $H_2$ gas is not flowed together with the reaction gas, a SiN film may be formed, which is somewhat effective. However, as shown in Example 2 to be described later, when the $H_2$ gas is flowed together with the reaction gas and the mixture of the reaction gas and the $H_2$ gas is irradiated with the ultraviolet rays, a SiN film having higher etching resistance can be obtained, which is more effective.

Further, the main wavelength of the ultraviolet ray irradiated to the $NH_3$ gas may be 105 to 220 nm. The ultraviolet ray irradiated to the reaction gas may selectively have a wavelength at which a peak, where the absorbance indicated by the absorption spectrum of the reaction gas used suddenly rises, appears. In the embodiment of the present disclosure, the xenon excimer lamp 32 is used for the ultraviolet irradiating part 3, but the main wavelength of the ultraviolet ray can be changed by changing a gas charged in the excimer lamp. As one example, when an Ar excimer lamp is used, the main wavelength can be changed to 126 nm. As another example, when a Kr excimer lamp is used, the main wavelength can be changed to 146 nm. In this manner, a gas charged in the excimer lamp may be changed according to the type of the reaction gas used.

The ultraviolet irradiating part 3 may also be configured to emit an ultraviolet ray of wavelengths over a wide range of wavelengths set so as to include a plurality of peaks at which the absorbance indicated by the absorption spectrum of the reaction gas suddenly increases. The ultraviolet irradiating part 3 that irradiates the reaction gas with the ultraviolet ray of wavelengths over a wide range of wavelengths in this manner has the same effects.

The ultraviolet irradiation window 31 for introducing the ultraviolet ray emitted from the ultraviolet irradiating part 3 into the reaction gas introduction path may be made of, for example, lithium fluoride (LiF), magnesium fluoride ($MgF_2$), calcium fluoride ($CaF_2$). The ultraviolet ray emitted from the ultraviolet irradiating part 3 penetrates through the ultraviolet irradiation window 31 and then is introduced into the reactive gas introduction path. However, the ultraviolet irradiation window 31 differs in the wavelength range of the ultraviolet ray to be transmitted depending on the material thereof, and particularly, the short wavelength side of the wavelength range of the ultraviolet ray is liable to be restricted by the material of the ultraviolet irradiation window 31. The limit values of the short wavelength side of the wavelength range of the ultraviolet ray which can transmit through LiF, $MgF_2$ and $CaF_2$ are 105 nm, 110 nm and 150 nm, respectively. The limit value of the short wavelength side of the wavelength range of the ultraviolet ray which can transmit through quartz ($SiO_2$) shown in the embodiment is 155 nm. Therefore, when the ultraviolet irradiation window 31 is made of LiF, $MgF_2$ or $CaF_2$, it is possible to widen the wavelength range of the ultraviolet ray with which the reaction gas can be irradiated.

When the $NH_3$ gas is used as a nitriding gas for nitriding silicon, a chlorine-based gas is often used as a precursor gas in order to obtain a SiN film. However, in that case, since chlorine (Cl) is introduced into the SiN film, Cl is removed by performing a separate modifying process. The above embodiment is also advantageous in that a high quality SiN film can be formed at a low temperature without using a chlorine-based gas.

Further, the present disclosure may be applied to, for example, a so-called ALD (Atomic Layer Deposition) method in which a precursor gas and a reaction gas are alternately supplied plural times to repeat the adsorption of the precursor gas on the wafer W and the reaction of the precursor gas and the reaction gas to form a SiN film by depositing SiN one molecular layer at a time.

EXAMPLES

In order to verify the effects of the embodiment of the present disclosure, the following test was conducted. FIG. 3 shows a film forming apparatus for an evaluation test. As shown in FIG. 3, the film forming apparatus for the evaluation test includes a reaction chamber 101 constituted by, for example, a vacuum vessel. A mounting table 200 on which a band-shaped evaluation substrate 100 having a length of 6 cm is mounted is installed in the reaction chamber 101. In addition, a heater (not shown) is embedded in the mounting table 200 and is configured to heat a substrate mounted on the mounting table, such as the evaluation substrate, at a predetermined set temperature ranging between 100 degrees C. and 450 degrees C. A downstream side end portion of the $NH_3$ gas introduction path 51 shown in FIG. 1 is connected to the side surface on the one end side in the longitudinal direction of the evaluation substrate 100 in the reaction chamber 101. In addition, similarly to the $NH_3$ gas introduction path 51 shown in FIG. 1, an ultraviolet irradiating part 300 using a xenon excimer lamp 32 is disposed on the $NH_3$ gas introduction path 51 and is configured to irradiate a gas flowing through the $NH_3$ gas introduction path 51 for introducing an $NH_3$ gas into the reaction chamber 101 with an ultraviolet ray emitted from the xenon excimer lamp 32. In addition, in the film forming apparatus for evaluation shown in FIG. 3, a window part 33 is formed at a position irradiated with the ultraviolet ray of the xenon excimer lamp 32 in the ultraviolet irradiating part 300, and an ultraviolet ray measuring part 34 for detecting the intensity of the ultraviolet ray passing through the window part 33 is installed.

Further, a $Si_2H_6$ gas supply nozzle 64 for supplying a precursor gas toward the center portion of the evaluation substrate 100 mounted on the mounting table 200 is formed in the reaction chamber 101, and the downstream side end portion of the $Si_2H_6$ gas introduction path 61 shown in FIG. 1 is connected to the $Si_2H_6$ gas supply nozzle 64. Further, an exhaust port 14 for exhausting the internal atmosphere of the reaction chamber 101 is formed in the reaction chamber 101. One end of an exhaust pipe 15 is connected to the exhaust port 14 and a vacuum exhaust part 18 is connected to the other end of the exhaust pipe 15.

[Preliminary Test]

First of all, prior to describing the Example, a preliminary test for examining the characteristics of the film forming apparatus for the evaluation test will be described. As the preliminary test, the film forming apparatus for the evaluation test was used to perform a film forming process on the evaluation substrate 100 and a thickness distribution of a film formed on the evaluation substrate 100 according to a heating temperature of the evaluation substrate 100 was examined.

In the film forming apparatus for the evaluation test described above, the film forming process was performed with the temperature of the evaluation substrate 100 set to the normal temperature (25 degrees C.), 100 degrees C., 200 degrees C., 300 degrees C., 350 degrees C., 400 degrees C. and 450 degrees C. In performing the film forming process, the internal pressure of the reaction chamber 101 was set to 133 Pa, and an $NH_3$ gas and a $Si_2H_6$ gas were supplied at flow rates of 40 sccm and 0.5 sccm for 60 minutes, respectively.

The film thickness and refractive index of the formed film were examined at five points distant by 1 cm, 2 cm, 3 cm, 4 cm and 5 cm from the end portion of the $NH_3$ gas supply side on the surface of each evaluation substrate 100 after the film forming processing. The measurements of the film thickness and refractive index of the film at the five points were made with a spectroscopic ellipsometer.

Figure 3:
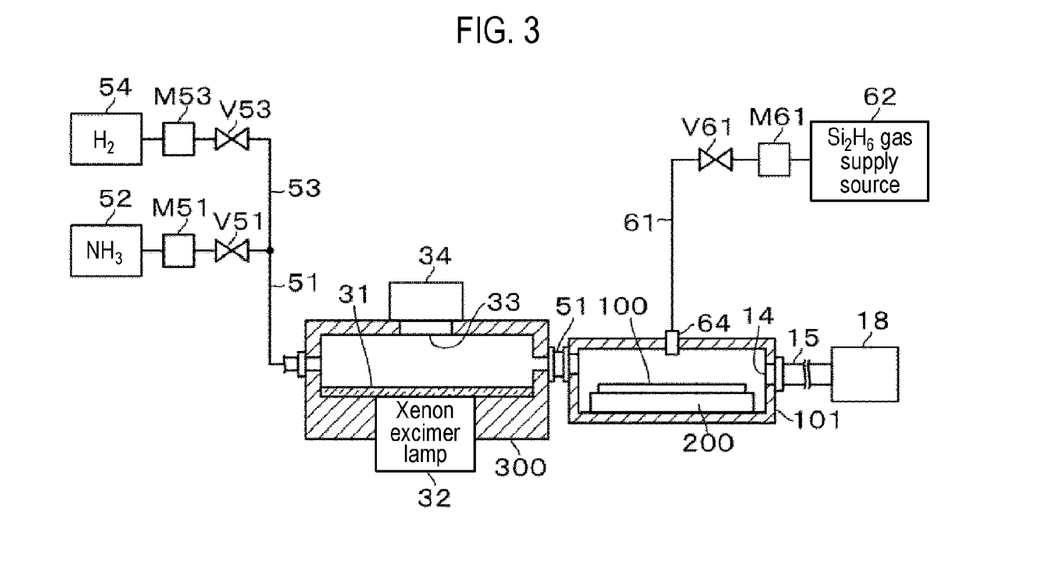
FIG. 3 is a longitudinal sectional view showing a film forming apparatus for an evaluation test.
Figure 4A:
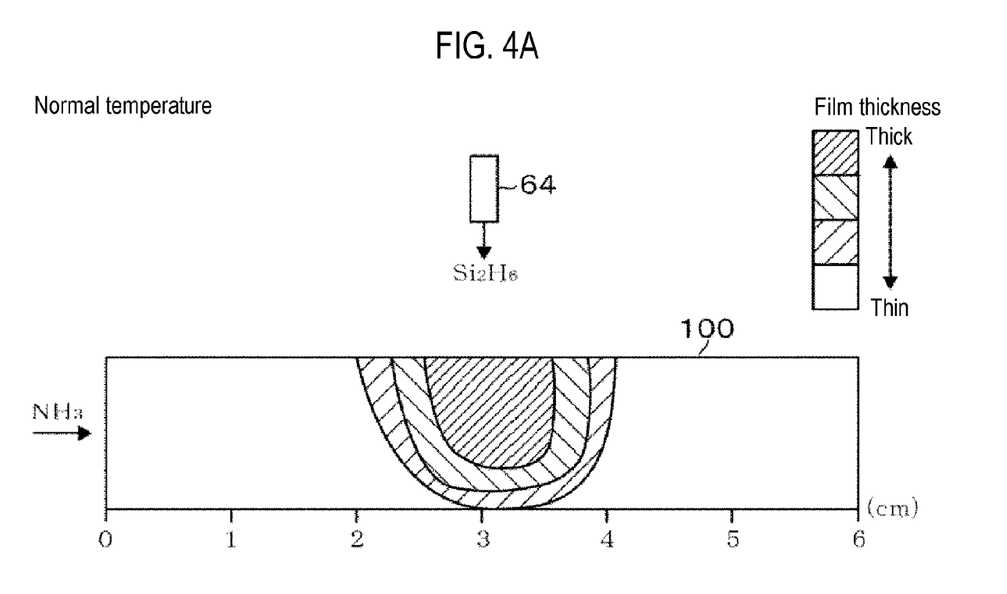
FIGS. 4A and 4B are explanatory views for explaining a film thickness distribution of a film formed according to a heating temperature of an evaluation substrate.
Figure 4B:
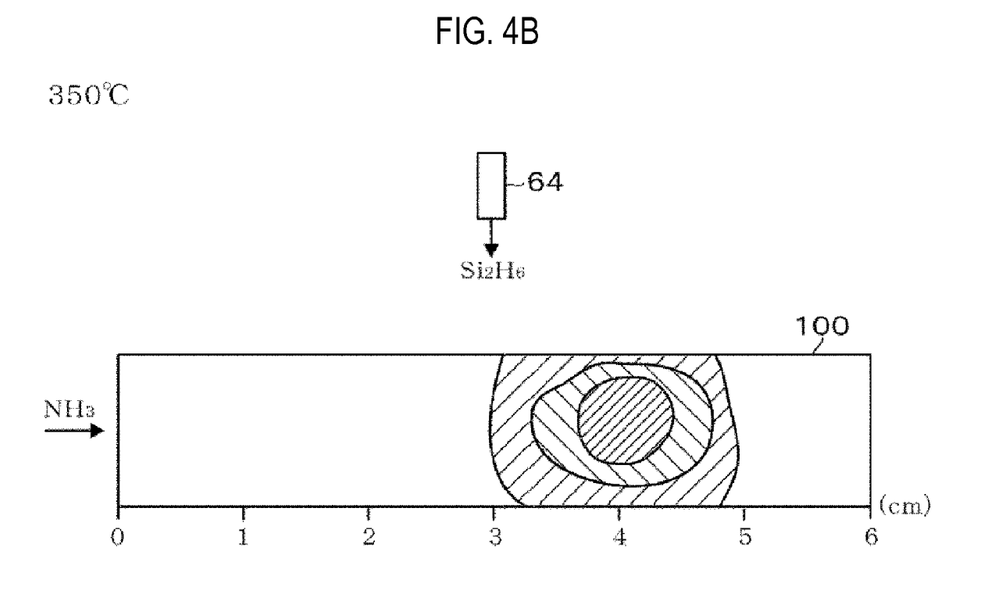

In the film forming apparatus for the evaluation test shown in FIG. 3, the film thickness distribution of SiN differs depending on the heating temperature of the evaluation substrate 100. FIGS. 4A and 4B schematically show the film thickness distribution of the evaluation substrate 100 when the film forming apparatus for the evaluation test is used to form a film with the temperature of the evaluation substrate 100 set at the normal temperature (25 degrees C.) and 350 degrees C. As shown in FIG. 4A, in the case where a film is formed with the temperature of the evaluation substrate 100 set at the normal temperature, the film thickness at a position near the center of the evaluation substrate 100 (a position distant by 3 cm from the $NH_3$ gas supply side in the evaluation substrate 100) is thick. Further, as shown in FIG. 4B, in the case where a film is formed with the temperature of the evaluation substrate 100 set at 350 degrees C., assuming that the $NH_3$ gas supply side is the front side, the film thickness at the back side of the evaluation substrate 100 tends to be thicker than the center of the evaluation substrate 100.

Figure 5:
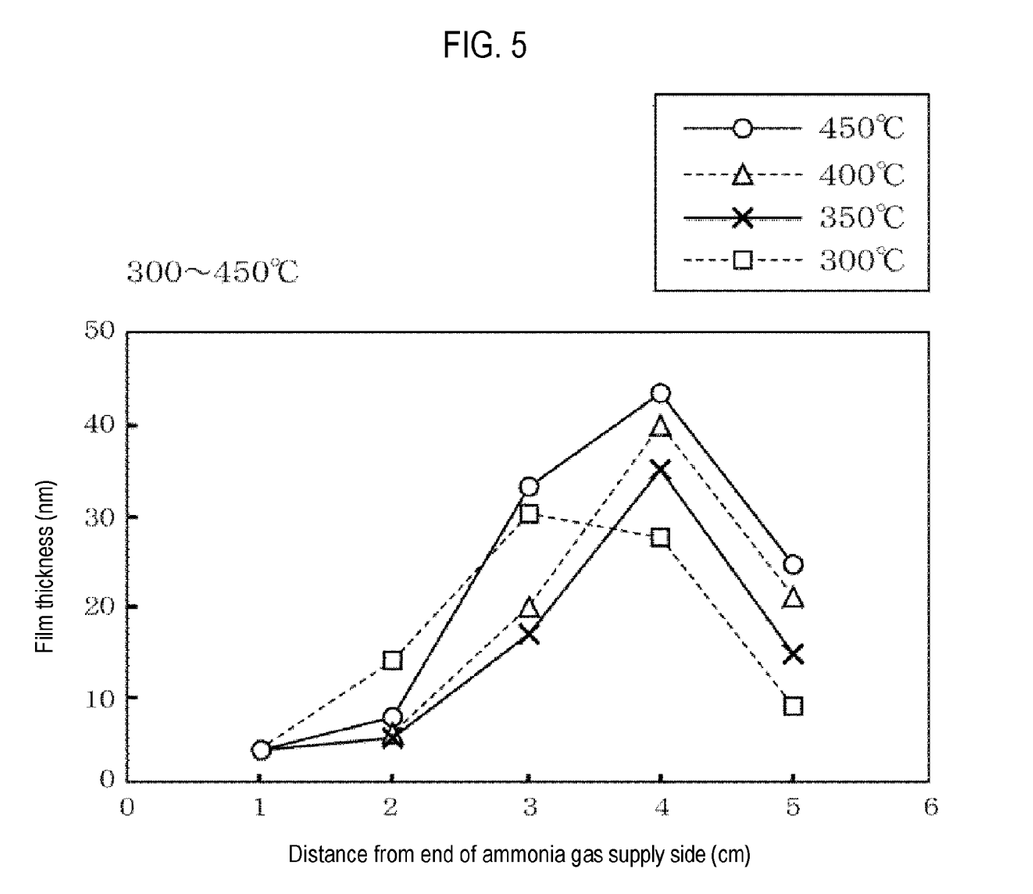
FIG. 5 is a characteristic diagram showing a film thickness distribution of a film formed according to a heating temperature of an evaluation substrate.
Figure 6:
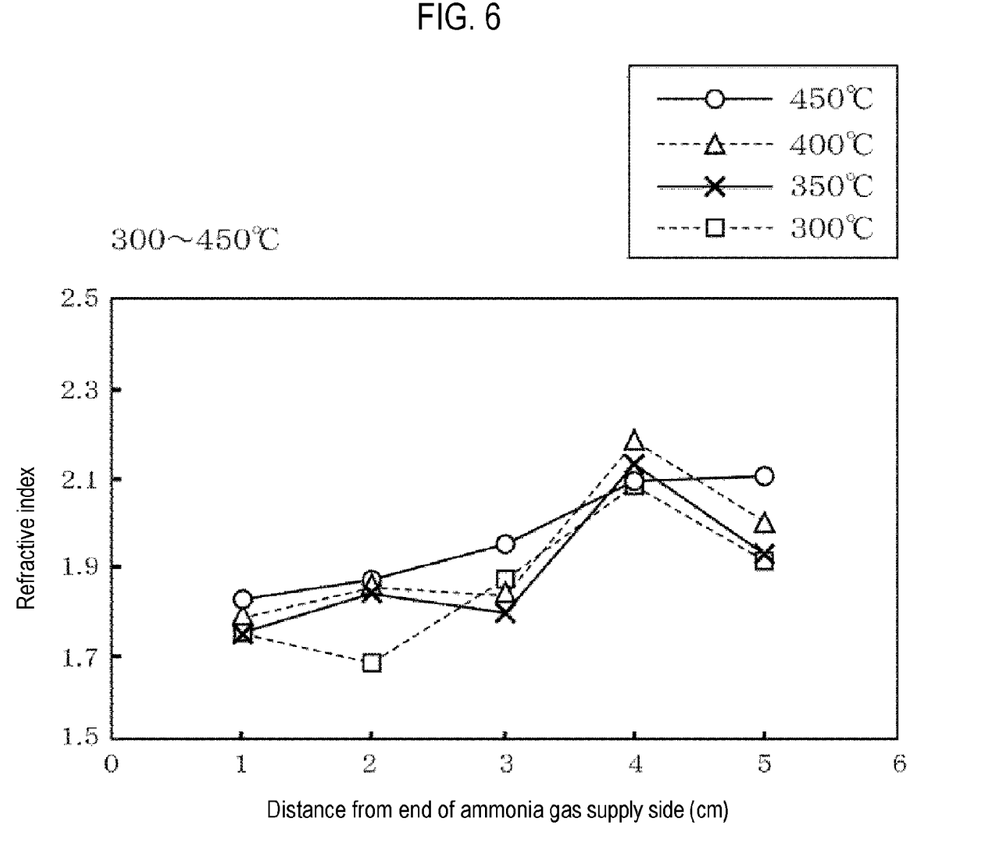
FIG. 6 is a characteristic diagram showing a refractive index of a film formed according to a heating temperature of an evaluation substrate.
Figure 7:
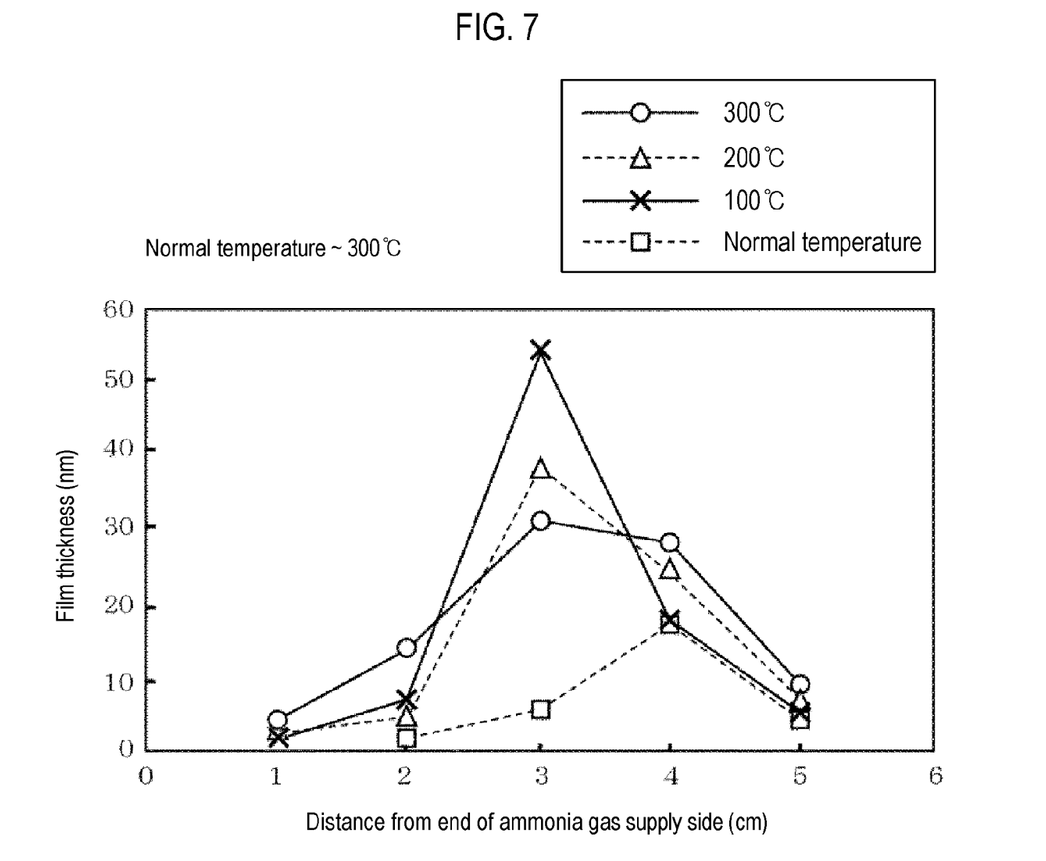
FIG. 7 is a characteristic diagram showing a film thickness distribution of a film formed according to a heating temperature of an evaluation substrate.
Figure 8:
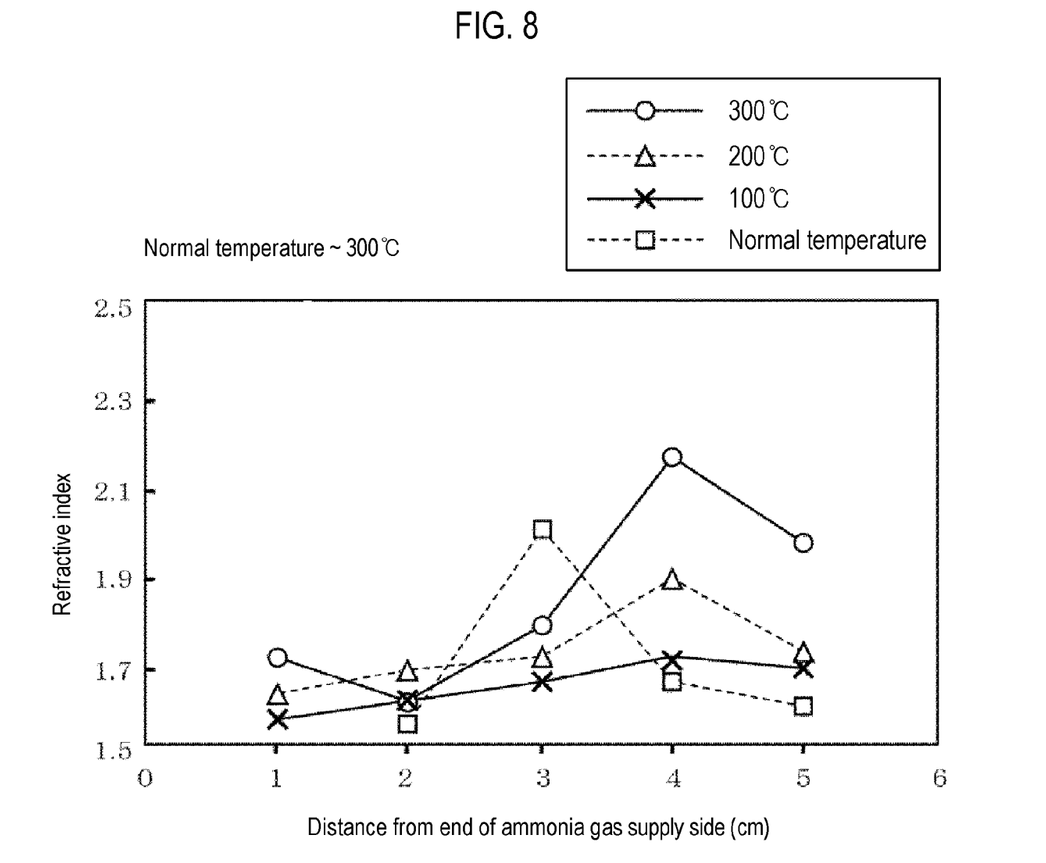
FIG. 8 is a characteristic diagram showing a refractive index of a film formed according to a heating temperature of an evaluation substrate.

FIGS. 5 and 7 are characteristic diagrams showing the film thickness distribution of the formed film according to the temperature of the evaluation substrate 100. FIGS. 6 and 8 are characteristic diagrams showing the refractive index of the formed film corresponding to the temperature of the evaluation substrate 100. In each of FIGS. 5 and 7, the horizontal axis represents a distance from the end of the NH$_3$ gas supply side in the evaluation substrate 100, and the vertical axis represents a film thickness of the formed film. In the case where the temperature of the evaluation substrate 100 is set at 25 degrees C., since almost no film is formed at a position distant by 1 cm from the end of the NH$_3$ gas supply side, the film thickness and refractive index of the formed film are not shown in FIGS. 7 and 8.

As shown in FIG. 5, in the case where the temperature of the evaluation substrate 100 is set to 350 degrees C. to 450 degrees C., the film thickness is the thickest at a position distant by about 4 cm from the end of the NH$_3$ gas supply side in the evaluation substrate 100. In addition, the refractive index of the film is as high as "2" because the film thickness is thick at the position distant by about 4 cm from the end of the NH$_3$ gas supply side on the surface of the evaluation substrate 100. As shown in FIG. 7, when the temperature of the evaluation substrate 100 is 100 to 300 degrees C., the film thickness at a position (the center portion of the evaluation substrate 100) distant by about 3 cm from the end of the NH$_3$ gas supply side on the surface of the evaluation substrate 100 is the thickest.

Therefore, in performing the film forming process with the film forming apparatus for the evaluation test, when the temperature of the evaluation substrate 100 is 300 degrees C. or lower, a film is more likely to be formed at the vicinity of the center portion of the evaluation substrate 100. When the temperature of the evaluation substrate 100 is 350 degrees C. or higher, a film is more likely to be formed at a position deviated to the back side from the center portion of the evaluation substrate 100. Accordingly, in the following Examples, a position at which the film thickness of the formed film is thick is selected as a measurement position depending on the set temperature of the evaluation substrate 100 in the film forming process.

Further, a high quality SiN film having high etching resistance has a refractive index of about "2". As shown in FIGS. 6 and 8, the refractive index of the evaluation substrate shows a value close to "2" at a position distant by about 3 cm to 4 cm from the end of the NH$_3$ gas supply side on the surface of the evaluation substrate 100, which can be said that a high quality SiN film is formed by the film forming apparatus for the evaluation test.

Example 1

The atomic composition in thickness direction and the refractive index of a film formed by using the above-described film forming apparatus for the evaluation test were examined.

Example 1-1

In Example 1-1, the film forming process described in the embodiment is performed under the conditions where the heating temperature of the evaluation substrate 100 is set at 400 degrees C., the internal pressure of the reaction chamber 101 is set to 133 Pa, and an NH$_3$ gas, a H$_2$ gas and a Si$_2$H$_6$ gas are supplied at flow rates of 100 sccm, 300 sccm and 0.5 sccm for 60 minutes, respectively.

Example 1-2

In Example 1-2, the same film forming process as Example 1-1 is performed except that the heating temperature of the evaluation substrate 100 is set at 350 degrees C. and the NH$_3$ gas is supplied at a flow rate of 78 sccm.

Example 1-3

In Example 1-3, the same film forming process as Example 1-2 is performed except that the heating temperature of the evaluation substrate 100 is set at 200 degrees C.

The atomic composition in thickness direction and the refractive index of a film formed on the evaluation substrate 100 in each of Examples 1-1 to 1-3 were examined. In each Example, a measurement position at which the atomic composition in depth direction from the surface of the film and the refractive index of the film were measured was set based on the set temperature and the film thickness distribution in the preliminary test. Therefore, for Examples 1-1 and 1-2, the measurement position was set at a position in the vicinity of the center portion of the evaluation substrate 100 (a position distant by 4 cm from the end of the ammonia gas supply side in the evaluation substrate). For Example 1-3, the measurement position was set at a position distant by 3 cm from the end of the NH$_3$ gas supply side in the evaluation substrate 100.

The atomic composition of each of silicon (Si), nitrogen (N), oxygen (O) and carbon (C) was measured using XPS (X-ray Photoelectron Spectroscopy). The refractive index was measured using a spectroscopic ellipsometer.

Figure 9:
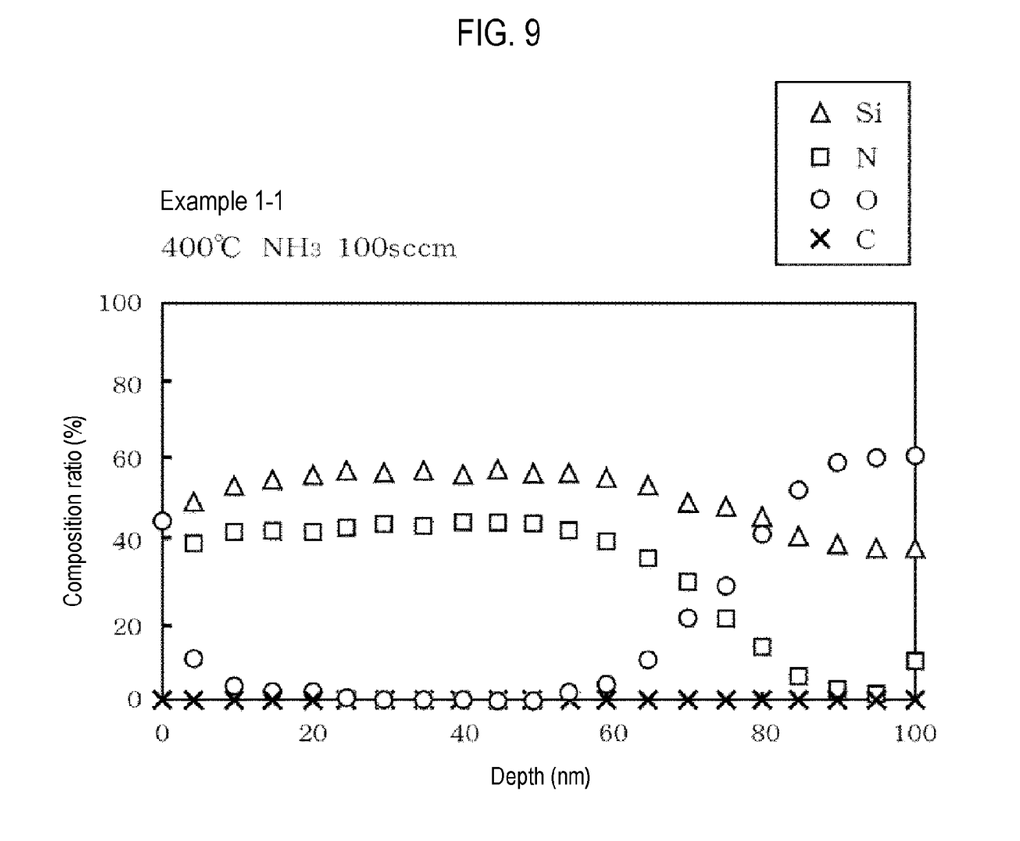
FIG. 9 is a characteristic diagram showing an atomic composition of a film formed in Example 1-1.
Figure 10:
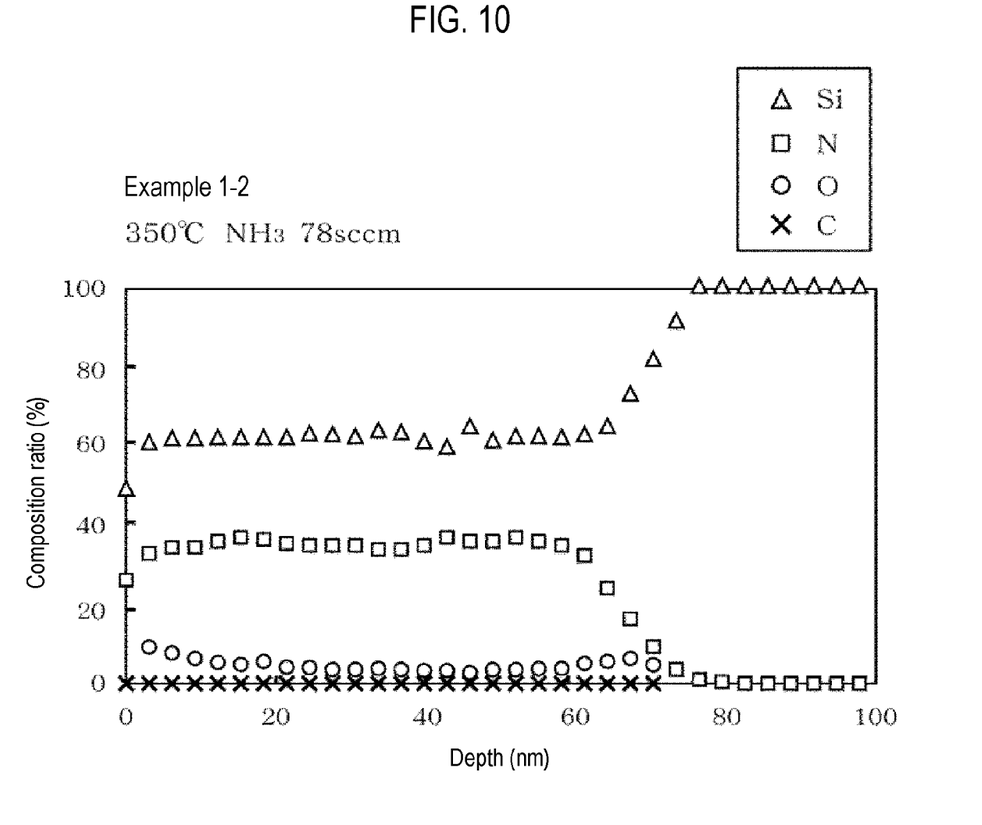
FIG. 10 is a characteristic diagram showing an atomic composition of a film formed in Example 1-2.
Figure 11:
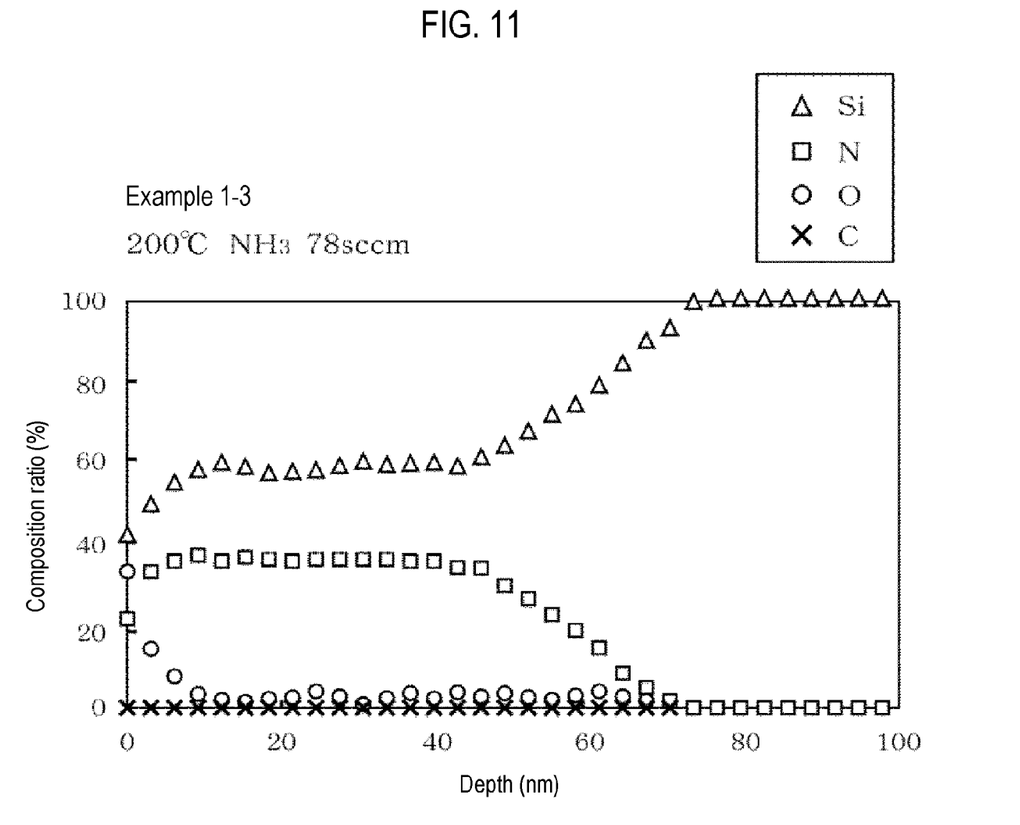
FIG. 11 is a characteristic diagram showing an atomic composition of a film formed in Example 1-3.

FIGS. 9 to 11 are characteristic diagrams showing the atomic compositions of a formed film at the measurement points in Examples 1-1 to 1-3, respectively, in which the horizontal axis represents a position in the depth direction of the film and the vertical axis represents the composition ratio of each atom. As can be seen from FIGS. 9 to 11, since the composition ratio with SiN is so large in any of Examples 1-1, 1-2 and 1-3, it can be said that a SiN film can be formed. In addition, the refractive indices of the films formed in Examples 1-1, 1-2 and 1-3 are 2.065, 1.881 and 2.044, respectively. As described previously, since the refractive index of the high quality silicon nitride film is about 2, it can be said that a high quality SiN film is formed according to Examples 1-1 to 1-3.

Example 2

In order to verify the etching resistance of the formed film, a film forming process was performed on the evaluation substrate according to the following Examples and an etching rate by a DHF (dilute hydrofluoric acid) solution was examined.

Example 2-1

In Example 2-1, the film forming process described in the embodiment is performed under the conditions where the heating temperature of the evaluation substrate is set at 400 degrees C., the internal pressure of the reaction chamber 101 is set to 133 Pa. and an NH$_3$ gas, a H$_2$ gas and a Si$_2$H$_6$ gas are supplied at flow rates of 100 sccm, 300 sccm and 1.0 sccm for 60 minutes, respectively.

Examples 2-2 to 2-4

In Examples 2-2 to 2-4, the same film forming process as Example 2-1 is performed except that the flow rate ratio of the supplied gas is set as shown in Table 1 to be described later.

In each of Examples 2-1 to 2-4, the film forming process was performed on the evaluation substrate. After that, the evaluation substrate was immersed and etched in 0.5% DHF and the etching rate was examined. Table 1 shows the results, showing the etching rates with respect to the supply flow rates of the $NH_3$ gas, the $H_2$ gas and the $Si_2H_6$ gas in Examples 2-1 to 2-4.

TABLE 1

| | $NH_3$ gas flow rate (sccm) | $H_2$ gas flow rate (sccm) | $Si_2H_6$ gas flow rate (sccm) | Pressure (kPa) | Etching rate (nm/min) |
|---|---|---|---|---|---|
| Example 2-1 | 100 | 300 | 1.0 | 0.39 | 10.3 |
| Example 2-2 | 200 | 200 | 1.0 | 0.44 | 15.5 |
| Example 2-3 | 100 | 300 | 0.2 | 0.4 | 7.6 |
| Example 2-4 | 100 | 300 | 0.5 | 0.37 | 4.9 |

As shown in Table 1, the etching rate is 10.3 nm/min when the flow rate of the $H_2$ gas mixed with the $NH_3$ gas is 300 sccm, whereas the etching rate is 15.5 nm/min when the flow rate of the $H_2$ gas is 200 sccm. All of these values are good as compared with a case where no $H_2$ gas is added to the $NH_3$ gas. By increasing the flow rate of the $Si_2H_6$ gas, the etching rate is lowered. Specifically, when the flow rate of the $Si_2H_6$ gas is set to 0.5 sccm, the etching rate can be lowered to 4.9 nm/min. Further, in any of Examples, the etching resistance is equal to or higher than that of a silicon oxide film, which can be said that a high quality silicon nitride film having high etching resistance can be formed by the film forming method of the present disclosure.

According to the present disclosure in some embodiments, in forming a silicon nitride film on a substrate, a reaction gas before reacting with a precursor gas containing silicon is excited by an ultraviolet ray. Therefore, the electron energy in the activated gas is small and damage to the substrate is accordingly suppressed. In addition, since the substrate in the processing container is not irradiated with the ultraviolet ray, it is possible to prevent the substrate from being damaged due to irradiation with the ultraviolet ray and it is also possible to avoid inhibition of the ultraviolet irradiation caused by adhesion of reaction products of a precursor gas and a reaction gas to an ultraviolet irradiation window.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a silicon nitride film on a substrate by having a precursor gas containing silicon to react with a reaction gas containing nitrogen, comprising:
   a processing container configured to form a vacuum atmosphere;
   a substrate mounting part installed in the processing container;
   a precursor gas supply part configured to supply a precursor gas containing silicon into the processing container;
   a reaction gas supply part configured to supply a reaction gas of a mixture of an ammonia gas and a hydrogen gas into the processing container; and
   an ultraviolet irradiating part interposed between the processing container and the reaction gas supply part and configured to excite the reaction gas before the reaction gas reacts with the precursor gas,
   wherein the reaction gas is supplied into the processing container via the ultraviolet irradiating part, and
   wherein a substrate on the substrate mounting part is not irradiated with an ultraviolet ray emitted from the ultraviolet irradiating part.

2. The film forming apparatus of claim 1, wherein the ultraviolet irradiating part is installed so as to irradiate a reaction gas introduction path for introducing the reaction gas from the reaction gas supply part into the processing container with the ultraviolet ray.

3. The film forming apparatus of claim 1, wherein a main wavelength of the ultraviolet ray emitted from the ultraviolet irradiating part is selected corresponding to a wavelength that is an absorption spectrum of the reaction gas supplied by the reaction gas supply part.

4. The film forming apparatus of claim 3, wherein the main wavelength of the ultraviolet ray emitted from the ultraviolet irradiating part is 105 nm or more and 220 nm or less.

5. The film forming apparatus of claim 4, wherein the ultraviolet irradiating part is constituted by a xenon excimer lamp.

6. The film forming apparatus of claim 1, wherein the ultraviolet irradiating part includes an ultraviolet irradiation window through which the ultraviolet ray emitted from the ultraviolet irradiating part passes before the reaction gas is irradiated, and the ultraviolet irradiation window is made of one selected from a group consisting of $SiO_2$, LiF, $MgF_2$ and $CaF_2$.

7. The film forming apparatus of claim 1, wherein a temperature of a processing atmosphere in which a film forming process is performed is between 25 degrees C. and 600 degrees C.

8. The film forming apparatus of claim 1, wherein a temperature of a processing atmosphere in which a film forming process is performed is between 200 degrees C. and 600 degrees C.

9. A method of forming a silicon nitride film on a substrate by having a precursor gas containing silicon to react with a reaction gas containing nitrogen, comprising:
   mounting a substrate on a mounting part in a processing container;
   supplying a precursor gas containing silicon into the processing container in a state where an interior of the processing container is in a vacuum atmosphere;
   exciting a reaction gas of a mixture of an ammonia gas and a hydrogen gas with an ultraviolet ray in an ultraviolet irradiating part before the reaction gas reacts with the precursor gas; and
   supplying the reaction gas excited in the ultraviolet irradiating part into the processing container,
   wherein the substrate on the mounting part is not irradiated with the ultraviolet ray.

10. The method of claim 9, wherein the ultraviolet irradiating part is installed so as to irradiate a reaction gas introduction path for introducing the reaction gas from a reaction gas supply part into the processing container with the ultraviolet ray.

11. The method of claim 9, wherein a main wavelength of the ultraviolet ray emitted from the ultraviolet irradiating part is selected corresponding to a wavelength that is an absorption spectrum of the reaction gas supplied by a reaction gas supply part.

12. The method of claim 11, wherein the main wavelength of the ultraviolet ray emitted from the ultraviolet irradiating part is 105 nm or more and 220 nm or less.

13. The method of claim 12, wherein the ultraviolet irradiating part is constituted by a xenon excimer lamp.

14. The method of claim 9, wherein the ultraviolet irradiating part includes an ultraviolet irradiation window through which the ultraviolet ray emitted from the ultraviolet irradiating part passes before the reaction gas is irradiated, and the ultraviolet irradiation window is made of one selected from a group consisting of $SiO_2$, LiF, $MgF_2$ and $CaF_2$.

15. The method of claim 9, wherein a temperature of a processing atmosphere in which the forming the silicon nitride film is performed is between 25 degrees C. and 600 degrees C.

16. The method of claim 9, wherein a temperature of a processing atmosphere in which the forming the silicon nitride film is performed is between 200 degrees C. and 600 degrees C.

* * * * *

UNITED STATES PATENT AND TRADEMARK OFFICE
CERTIFICATE OF CORRECTION

PATENT NO. : 10,559,460 B2
APPLICATION NO. : 16/123416
DATED : February 11, 2020
INVENTOR(S) : Akira Shimizu et al.

Page 1 of 1

It is certified that error appears in the above-identified patent and that said Letters Patent is hereby corrected as shown below:

On the Title Page

Item (73), please add the Assignee: "TOHOKU UNIVERSITY Sendai-shi, Miyagi (JP)"

Signed and Sealed this
Thirtieth Day of June, 2020

Andrei Iancu
*Director of the United States Patent and Trademark Office*